(12) United States Patent
Chen et al.

(10) Patent No.: US 12,713,708 B2
(45) Date of Patent: Aug. 18, 2026

(54) ESD PROTECTION CIRCUIT FOR NEGATIVE VOLTAGE OPERATION

(71) Applicant: MEDIATEK INC., Hsin-Chu (TW)

(72) Inventors: Ming-Chun Chen, Hsinchu City (TW); Bo-Shih Huang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 405 days.

(21) Appl. No.: 18/373,288

(22) Filed: Sep. 27, 2023

(65) Prior Publication Data

US 2024/0153945 A1 May 9, 2024

Related U.S. Application Data

(60) Provisional application No. 63/382,892, filed on Nov. 9, 2022.

(51) Int. Cl.
*H10D 89/60* (2025.01)

(52) U.S. Cl.
CPC .................................. *H10D 89/713* (2025.01)

(58) Field of Classification Search
CPC .. H10D 89/713; H10D 89/811; H10D 89/611; H10D 89/819
USPC .......................................................... 361/56
See application file for complete search history.

(56) References Cited

U.S. PATENT DOCUMENTS

| | | | | |
|---|---|---|---|---|
| 5,637,900 A | 6/1997 | Ker | | |
| 6,940,104 B2 | 9/2005 | Yeh et al. | | |
| 2002/0130390 A1* | 9/2002 | Ker | H10D 89/611 | 257/E29.328 |
| 2002/0154463 A1* | 10/2002 | Mergens | H03K 17/0814 | 361/111 |
| 2004/0212936 A1* | 10/2004 | Salling | H10D 89/815 | 361/111 |
| 2006/0152868 A1 | 7/2006 | Ker | | |

OTHER PUBLICATIONS

Da-Wei Lai et al., Bidirectional ESD Protection Device Using PNP With pMOS-Controlled Nwell Bias, Mar. 2018, p. 331-334, vol. 39, No. 3, IEEE Electron Device Letters, XP011678765, Mar. 2018.

* cited by examiner

*Primary Examiner* — Sreeya Sreevatsa
(74) *Attorney, Agent, or Firm* — Winston Hsu

(57) ABSTRACT

The present invention provides a chip including an I/O pin and an ESD protection circuit. The ESD protection circuit includes a P-type device and a first diode, wherein the P-type device is coupled between the I/O pin and a ground voltage, and an anode of the first diode is directly connected to the I/O pin. In addition, the ESD protection circuit does not comprise any device whose N-type doping/diffusion is directly connected to the I/O pin.

8 Claims, 7 Drawing Sheets

ESD PROTECTION CIRCUIT FOR NEGATIVE VOLTAGE OPERATION

CROSS REFERENCE TO RELATED APPLICATIONS

This application claims the benefit of U.S. Provisional Application No. 63/382,892, filed on Nov. 9, 2022. The content of the application is incorporated herein by reference.

BACKGROUND

In order to protect internal circuits of a die from being damaged by electrostatic discharge (ESD), one or more ESD protection circuits are designed within the die to pass a human body model (HBM) and charged device model (CDM) of ESD specifications. In the conventional art, one or more diodes serving as the ESD protection circuit are connected between an input/output (I/O) pin and a ground voltage, and these diodes absorb the short-duration voltage pulses during the ESD strike, that is high peak currents from the ESD strike flow to the ground through the diodes and limit the ESD strike voltages from damaging the internal circuits.

However, when the ESD protection circuit having diodes is used for the I/O pin having negative voltage, a parasitic diode may be formed between the I/O pin and the ground voltage so that a junction forward leakage current is generated. To solve this problem, the conventional art uses a deep N-well isolation technique to isolate the P-type diffusion of the first diode and the N-type diffusion of the last diode. However, the deep N-well process and mask will increase the manufacturing costs.

SUMMARY

It is therefore an objective of the present invention to provide a ESD protection circuit for the I/O pin having a negative voltage, which can avoid leakage current without using deep N-well process, to solve the above-mentioned problems.

According to one embodiment of the present invention, a chip comprising an I/O pin and an ESD protection circuit is disclosed. The ESD protection circuit comprises a P-type device and a first diode, wherein the P-type device is coupled between the I/O pin and a ground voltage, and an anode of the first diode is directly connected to the I/O pin. In addition, the ESD protection circuit does not comprise any device whose N-type doping/diffusion is directly connected to the I/O pin.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
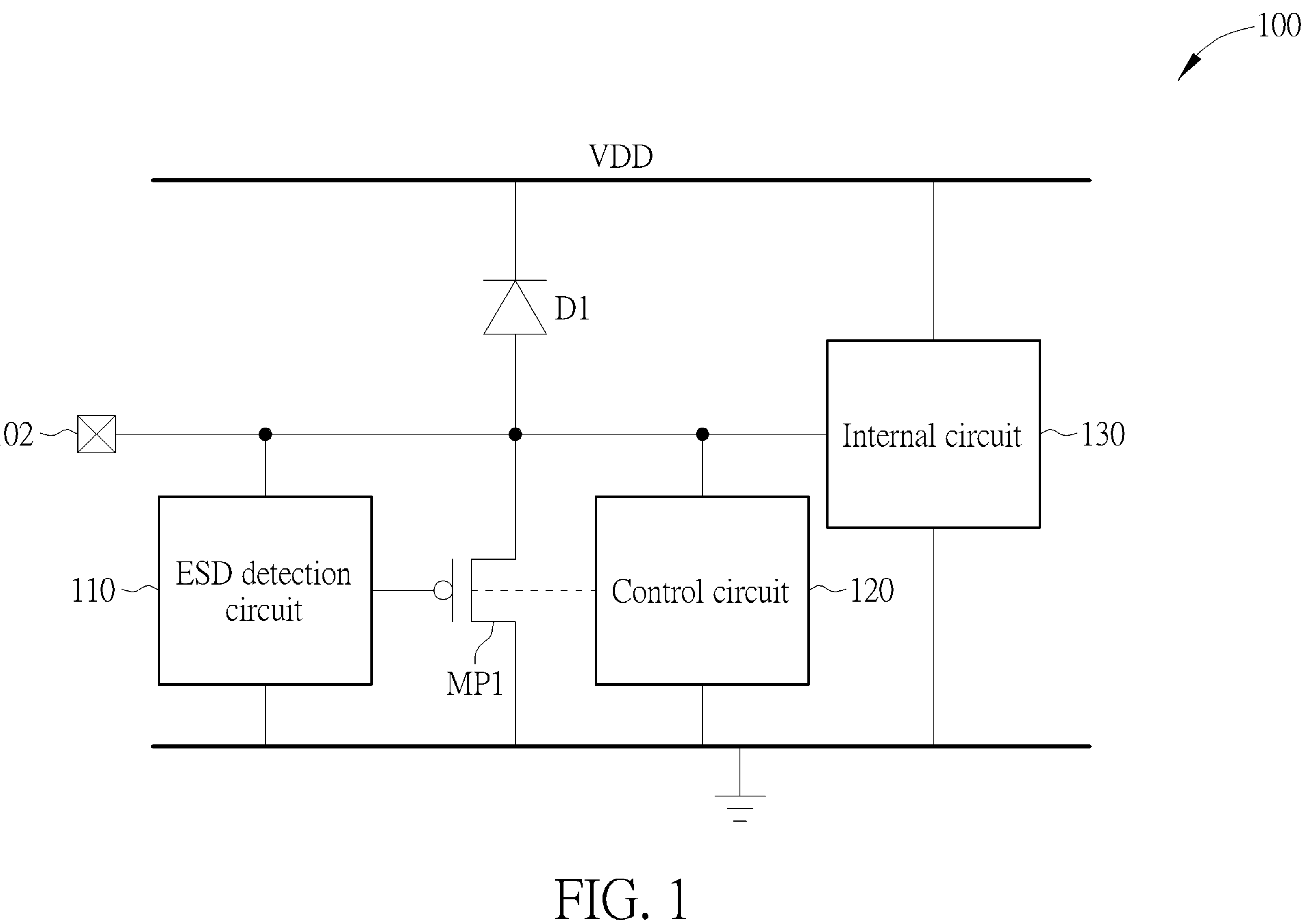
FIG. 1 is a diagram illustrating a chip according to a first embodiment of the present invention.

FIG. 1 is a diagram illustrating a chip 100 according to one embodiment of the present invention. As shown in FIG. 1, the chip 100 comprises an I/O pin 102, an ESD detection circuit 110, a control circuit 120, an internal circuit 130, and an ESD protection circuit comprising a P-type transistor MP1 and at least one diode D1, wherein the I/O pin 102 is used to receive a negative voltage from a device external to the chip 100, and the negative voltage is lower than a ground voltage, for example, the negative voltage may be −1V.

In the embodiment shown in FIG. 1, the P-type transistor MP1 and the diode D1 serves as the ESD protection circuit to absorb the short-duration voltage pulses during the ESD strike, wherein a drain electrode of the P-type transistor MP1 is directly connected to the I/O pin 102 without passing through any other circuit element, and a source electrode of the P-type transistor MP1 is coupled to the ground voltage, that is, there may or may not be other circuit element(s) between the source electrode and the ground voltage; an anode of the diode D1 is directly connected to the I/O pin 102 without passing through any other circuit element, and a cathode of the diode D1 is coupled to a supply voltage VDD, that is, there may or may not be other circuit element(s) between the cathode of the diode D1 and the supply voltage VDD. The ESD detection circuit 110 is configured to detect a voltage level of the I/O pin 102 to determine if enabling the P-type transistor MP1, that is, if the I/O pin 102 suffers ESD strikes, the ESD detection circuit 110 generates a control signal to enable the P-type transistor MP1 to form a current path; and the P-type transistor MP1 is disabled when the I/O pin 102 has the normal negative voltage. In addition, a bulk of the P-type transistor MP1 is connected to its source electrode or a bias voltage provided by the control circuit 120, wherein the control circuit 120 is an optional device that can be removed from the chip 100.

In this embodiment, the I/O pin 102 only connects to the anode of the diode D1 and the drain electrode of the P-type transistor MP1, without connecting to the cathode of any diode or source/drain electrode of any N-type transistor. Therefore, since the I/O pin 102 only connects to the P-type doping/diffusion (e.g., boron, aluminum, gallium or any other P-type dopant) of the semiconductor device, without directly connecting to any N-type doping/diffusion (e.g., phosphorus, arsenic or any other N-type dopant), a junction forward leakage current from the ground to the I/O pin 102 will not be generated, so that a power consumption of the chip 100 can be improved. In addition, because there is no need to use the deep N-well isolation technique in the ESD protection circuit, the manufacturing cost will not increase.

Figure 2:
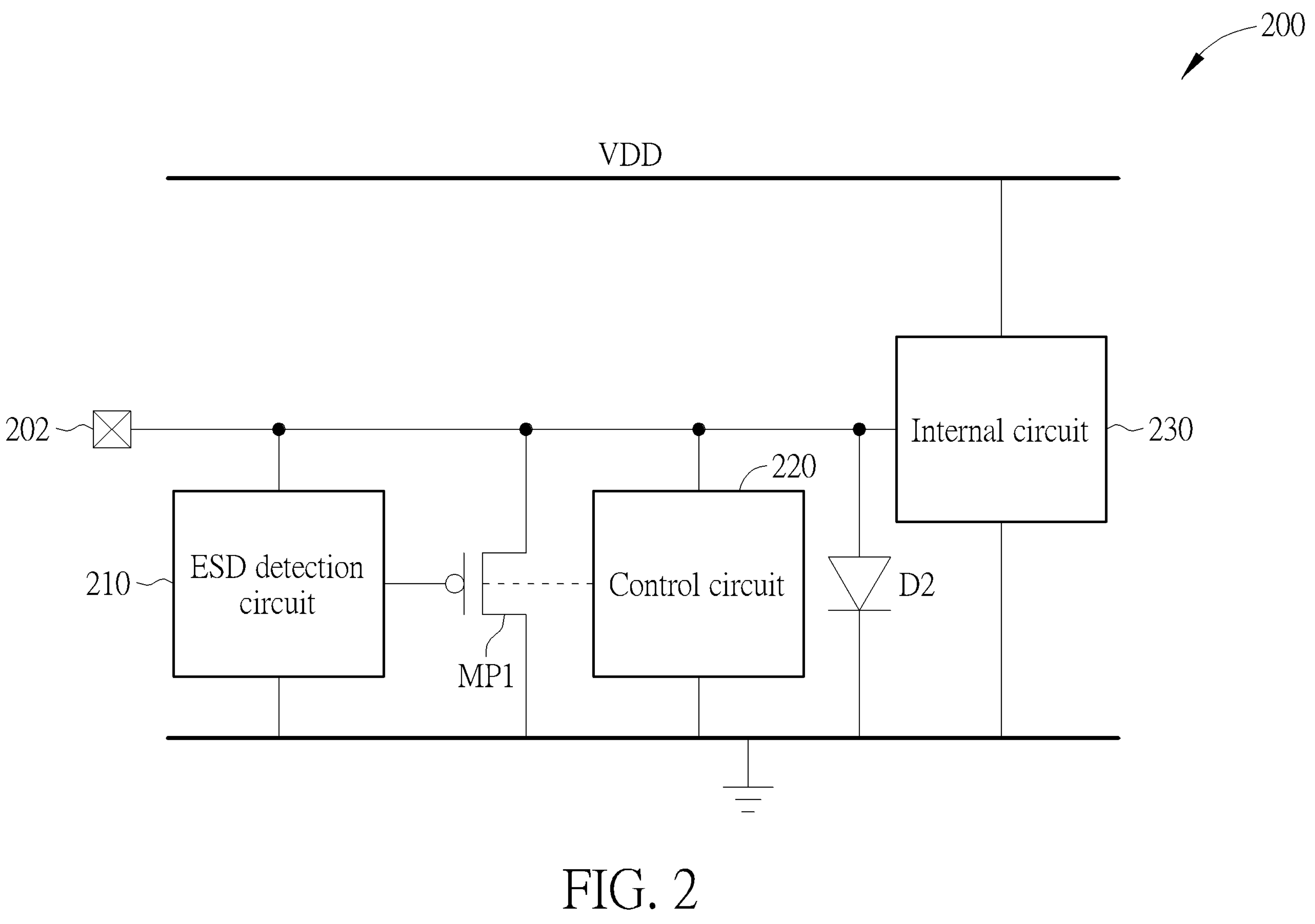
FIG. 2 is a diagram illustrating a chip according to a second embodiment of the present invention.

FIG. 2 is a diagram illustrating a chip 200 according to one embodiment of the present invention. As shown in FIG. 2, the chip 200 comprises an I/O pin 202, an ESD detection circuit 210, a control circuit 220, an internal circuit 230, and an ESD protection circuit comprising a P-type transistor MP1 and at least one diode D2, wherein the I/O pin 202 is used to receive a negative voltage from a device external to the chip 200, and the negative voltage is lower than the ground voltage.

In the embodiment shown in FIG. 2, the P-type transistor MP1 and the diode D2 serves as the ESD protection circuit to absorb the short-duration voltage pulses during the ESD strike, wherein a drain electrode of the P-type transistor MP1 is directly connected to the I/O pin 202 without passing through any other circuit element, and a source electrode of the P-type transistor MP1 is coupled to the ground voltage, that is, there may or may not be other circuit element(s) between the source electrode and the ground voltage; an anode of the diode D2 is directly connected to the I/O pin 202 without passing through any other circuit element, and a cathode of the diode D2 is coupled to the ground voltage, that is, there may or may not be other circuit element(s) between the cathode of the diode D2 and the ground voltage. The ESD detection circuit 210 is configured to detect a voltage level of the I/O pin 202 to determine if enabling the P-type transistor MP1, that is, if the I/O pin 202 suffers ESD strikes, the ESD detection circuit 210 enables the P-type transistor MP1 to form a current path; and the P-type transistor MP1 is disabled when the I/O pin 202 has the normal negative voltage. In addition, a bulk of the P-type transistor MP1 is connected to its source electrode or a bias voltage provided by the control circuit 220, wherein the control circuit 220 is an optional device that can be removed from the chip 200.

In this embodiment, the I/O pin 202 only connects to the anode of the diode D2 and the drain electrode of the P-type transistor MP1, without connecting to the cathode of any diode or source/drain electrode of any N-type transistor. Therefore, since the I/O pin 202 only connects to the P-type doping/diffusion of the semiconductor device, without directly connecting to any N-type doping/diffusion, a junction forward leakage current from the ground to the I/O pin 202 will not be generated, so that a power consumption of the chip 200 can be improved. In addition, because there is no need to use the deep N-well isolation technique in the ESD protection circuit, the manufacturing cost will not increase.

Figure 3:
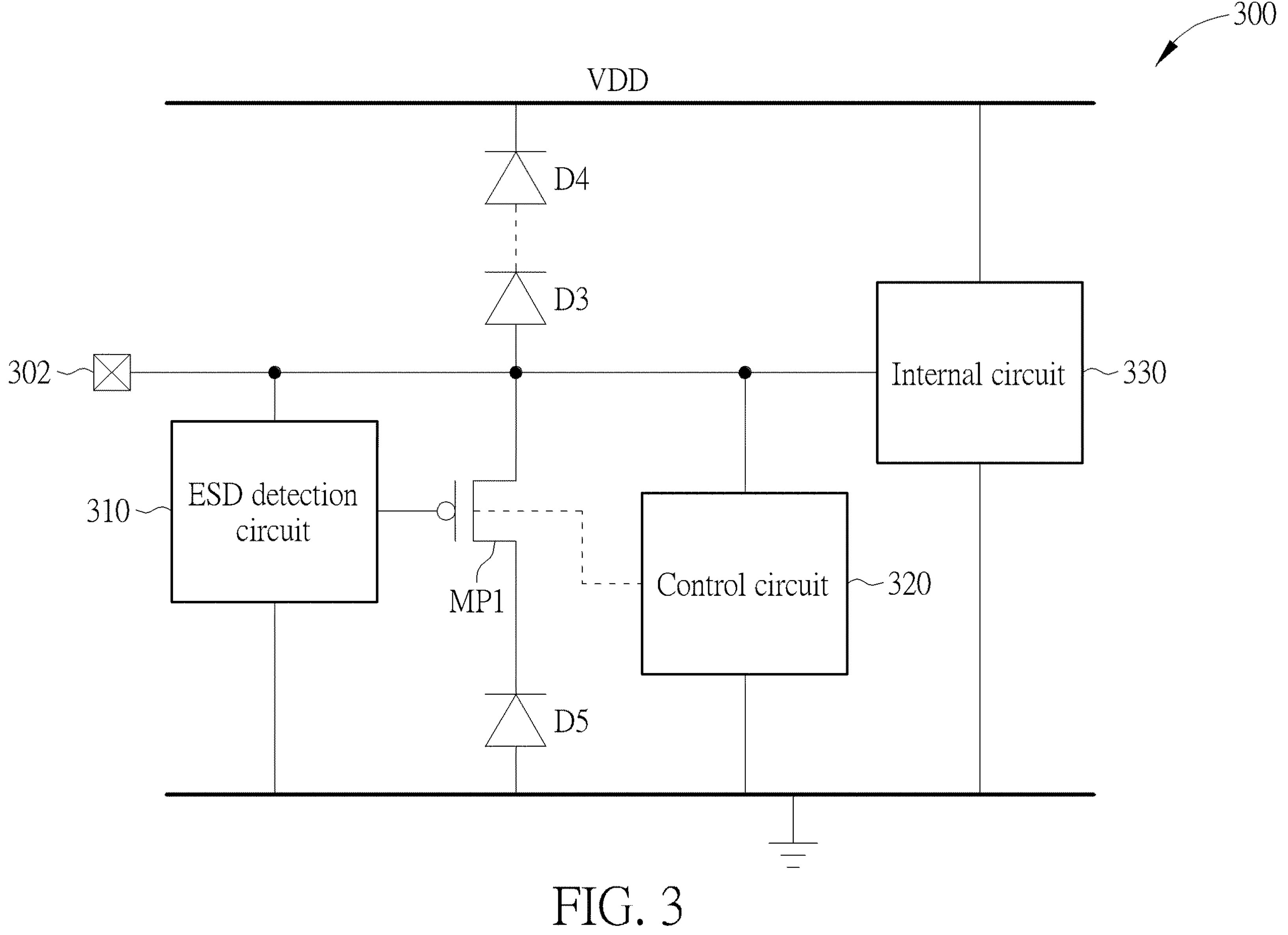
FIG. 3 is a diagram illustrating a chip according to a third embodiment of the present invention.

FIG. 3 is a diagram illustrating a chip 300 according to one embodiment of the present invention. As shown in FIG. 3, the chip 300 comprises an I/O pin 302, an ESD detection circuit 310, a control circuit 320, an internal circuit 330, and an ESD protection circuit comprising a P-type transistor MP1 and a plurality of diodes such as D3-D5, wherein the I/O pin 302 is used to receive a negative voltage from a device external to the chip 300, and the negative voltage is lower than the ground voltage.

In the embodiment shown in FIG. 3, the P-type transistor MP1 and the diodes D3-D5 serves as the ESD protection circuit to absorb the short-duration voltage pulses during the ESD strike, wherein a drain electrode of the P-type transistor MP1 is directly connected to the I/O pin 302 without passing through any other circuit element, and a source electrode of the P-type transistor MP1 is coupled to the ground voltage via the diode D5. In this embodiment, an anode of the diode D5 is connected to the ground voltage, a cathode of the diode D5 is coupled to the source electrode of the P-type transistor, wherein there may or may not be other circuit element(s) between the source electrode and the diode D5. The diodes D3 and D4 form a diode string, wherein an anode of the diode D3 is directly connected to the I/O pin 302 without passing through any other circuit element, and a cathode of the diode D4 is coupled to a supply voltage VDD, and there may or may not be other diode(s) between the diodes D3 and D4. The ESD detection circuit 310 is configured to detect a voltage level of the I/O pin 302 to determine if enabling the P-type transistor MP1, that is, if the I/O pin 302 suffers ESD strikes, the ESD detection circuit 310 enables the P-type transistor MP1 to form a current path; and the P-type transistor MP1 is disabled when the I/O pin 302 has the normal negative voltage. In addition, a bulk of the P-type transistor MP1 is connected to its source electrode or a bias voltage provided by the control circuit 320, wherein the control circuit 320 is an optional device that can be removed from the chip 300.

In this embodiment, the I/O pin 302 only connects directly to the anode of the diode D3 and the drain electrode of the P-type transistor MP1, without connecting directly to the cathode of any diode or source/drain electrode of any N-type transistor. Therefore, since the I/O pin 302 only connects to the P-type doping/diffusion of the semiconductor device, without directly connecting to any N-type doping/diffusion, a junction forward leakage current from the ground to the I/O pin 302 will not be generated, so that a power consumption of the chip 300 can be improved. In addition, because there is no need to use the deep N-well isolation technique in the ESD protection circuit, the manufacturing cost will not increase.

Figure 4:
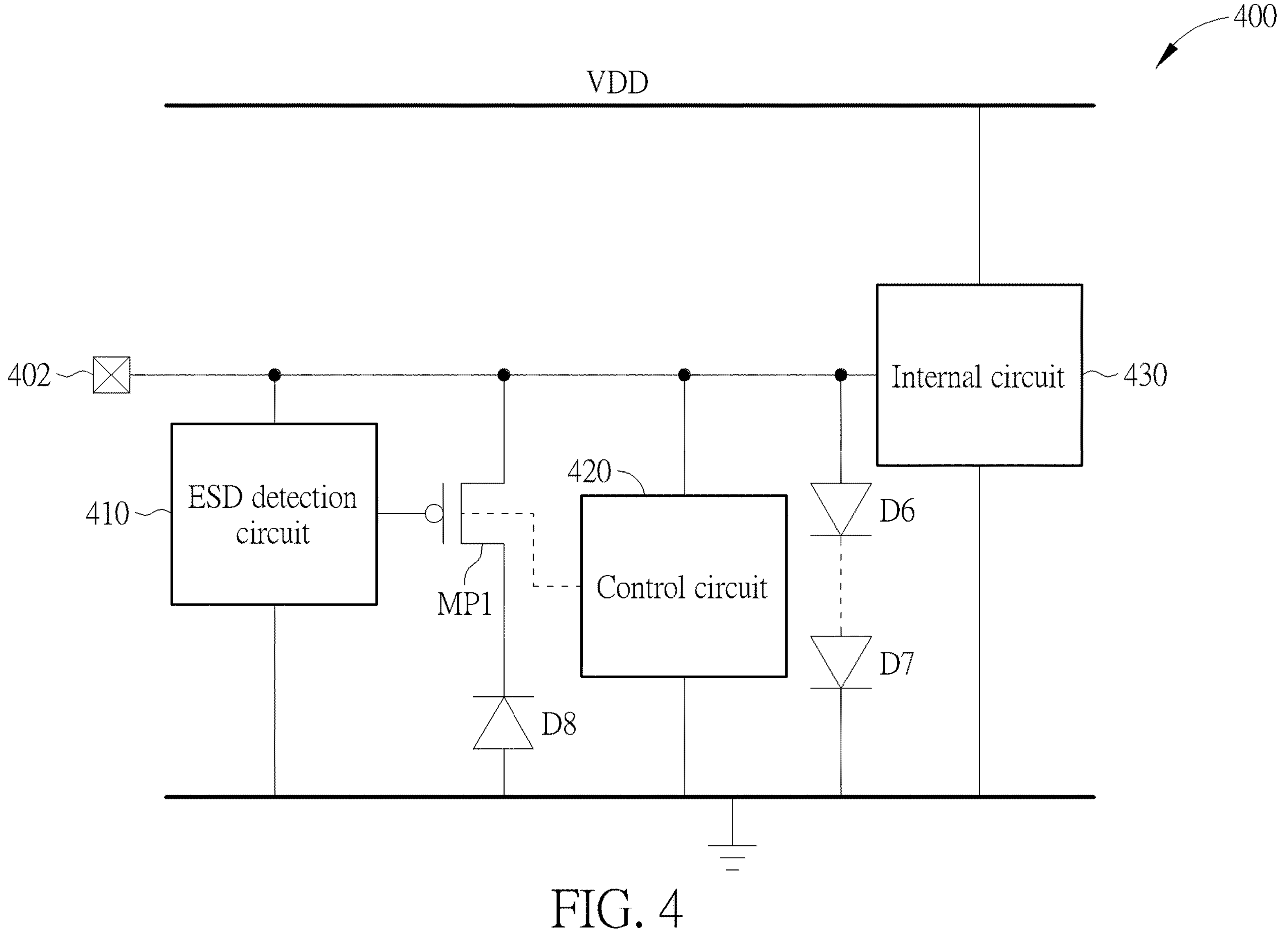
FIG. 4 is a diagram illustrating a chip according to a fourth embodiment of the present invention.

FIG. 4 is a diagram illustrating a chip 400 according to one embodiment of the present invention. As shown in FIG. 4, the chip 400 comprises an I/O pin 402, an ESD detection circuit 410, a control circuit 420, an internal circuit 430, and an ESD protection circuit comprising a P-type transistor MP1 and a plurality of diodes such as D6-D8, wherein the I/O pin 402 is used to receive a negative voltage from a device external to the chip 400, and the negative voltage is lower than the ground voltage.

In the embodiment shown in FIG. 4, the P-type transistor MP1 and the diodes D6-D8 serves as the ESD protection circuit to absorb the short-duration voltage pulses during the ESD strike, wherein a drain electrode of the P-type transistor MP1 is directly connected to the I/O pin 402 without passing through any other circuit element, and a source electrode of the P-type transistor MP1 is coupled to the ground voltage via the diode D8. In this embodiment, an anode of the diode D8 is connected to the ground voltage, a cathode of the diode D8 is coupled to the source electrode of the P-type transistor, wherein there may or may not be other circuit element (s) between the source electrode and the diode D8. The diodes D6 and D7 form a diode string, wherein an anode of the diode D6 is directly connected to the I/O pin 402 without passing through any other circuit element, and a cathode of the diode D7 is coupled to the ground voltage, and there may or may not be other diode(s) between the diodes D6 and D7. The ESD detection circuit 410 is configured to detect a voltage level of the I/O pin 402 to determine if enabling the P-type transistor MP1, that is, if the I/O pin 402 suffers ESD strikes, the ESD detection circuit 410 enables the P-type transistor MP1 to form a current path; and the P-type transistor MP1 is disabled when the I/O pin 402 has the normal negative voltage. In addition, a bulk of the P-type transistor MP1 is connected to its source electrode or a bias voltage provided by the control circuit 420, wherein the control circuit 420 is an optional device that can be removed from the chip 400.

In this embodiment, the I/O pin 402 only connects directly to the anode of the diode D6 and the drain electrode of the P-type transistor MP1, without connecting directly to the cathode of any diode or source/drain electrode of any N-type transistor. Therefore, since the I/O pin 402 only connects to the P-type doping/diffusion of the semiconductor device, without directly connecting to any N-type doping/diffusion, a junction forward leakage current from the ground to the I/O pin 402 will not be generated, so that a power consumption of the chip 400 can be improved. In addition, because there is no need to use the deep N-well isolation technique in the ESD protection circuit, the manufacturing cost will not increase.

Figure 5:
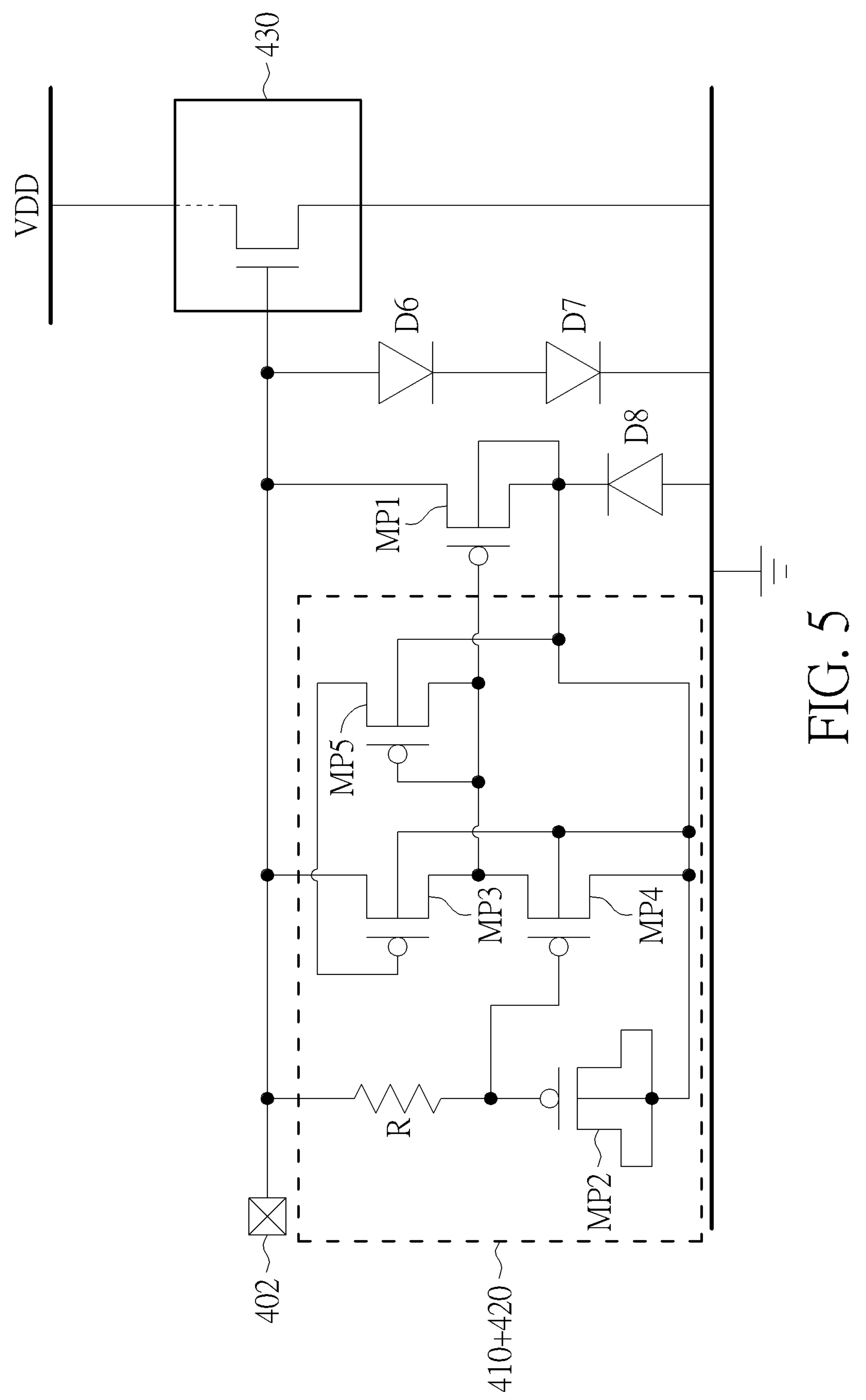
FIG. 5 is a diagram illustrating the ESD detection circuit, the control circuit and part of the internal circuit according to one embodiment of the present invention.

FIG. 5 is a diagram illustrating the ESD detection circuit 410, the control circuit 420 and part of the internal circuit 430 according to one embodiment of the present invention. As shown in FIG. 5, the ESD detection circuit 410 and the control circuit 420 comprise a resistor R, a P-type transistor MP2 serving as metal-oxide-semiconductor capacitor and a plurality of P-type transistors MP3-MP5, wherein a gate electrode of the P-type transistor MP2 is coupled to the I/O pin 402 via the resistor R, a drain electrode of the P-type transistor MP3 is directly connected to the I/O pin 402, a source electrode of the P-type transistor MP3 is coupled to a drain electrode of the P-type transistor MP4 and a gate electrode of the P-type transistor MP5, and a bulks of the P-type transistors MP1-MP5 and source electrodes of the P-type transistors MP1, MP2 and MP4 are connected together. In addition, for the internal circuit 430, the I/O pin 402 is directly connected to a gate electrode of a transistor within the internal circuit 430.

In this embodiment shown in FIG. 5, for the ESD detection circuit 410, the control circuit 420 and the internal circuit 430, the I/O pin 402 only connects directly to the drain electrode of the P-type transistor and a gate electrode of the transistor, without connecting directly to the cathode of any diode or source/drain electrode of any N-type transistor.

It is noted that the embodiments of the ESD detection circuit 410, the control circuit 420 and part of the internal circuit 430 shown in FIG. 5 are for illustrative, not a limitation of the present invention, as long as the ESD detection circuit 410 can detect a voltage level of the I/O pin 402 to determine if enabling the P-type transistor MP1, the ESD detection circuit 410, the control circuit 420 and part of the internal circuit 430 can have any suitable designs.

In addition, the embodiments of the ESD detection circuit 410, the control circuit 420 and part of the internal circuit 430 shown in FIG. 5 can be used to implement the ESD detection circuit 110/210/310, the control circuit 120/220/320 and part of the internal circuit 130/230/330 shown in FIG. 1, FIG. 2 or FIG. 3.

Figure 6:
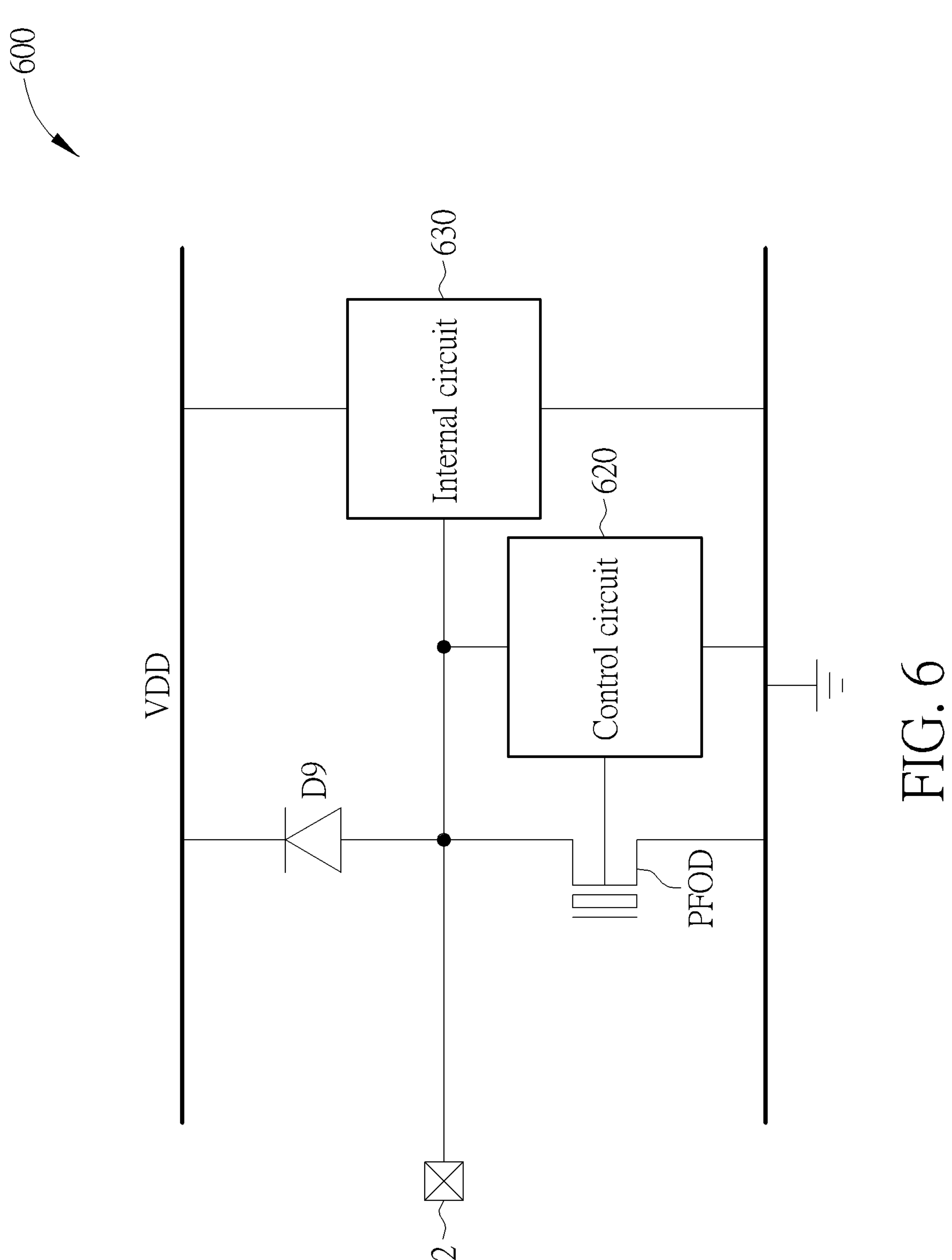
FIG. 6 is a diagram illustrating a chip according to a fifth embodiment of the present invention.

In the embodiment shown in FIG. 1-FIG. 5, the P-type transistor MP1 and the ESD detection circuit 110/210/310/410 can be replaced by any other suitable P-type device capable of forming a current path during the ESD strike. Specifically, FIG. 6 is a diagram illustrating a chip 600 according to one embodiment of the present invention. As shown in FIG. 6, the chip 600 comprises an I/O pin 602, a control circuit 620, an internal circuit 630, and an ESD protection circuit comprising a P-type field-oxide device (PFOD) and at least one diode D9, wherein the I/O pin 602 is used to receive a negative voltage from a device external to the chip 600, and the negative voltage is lower than a ground voltage.

In the embodiment shown in FIG. 6, the PFOD and the diode D9 serves as the ESD protection circuit to absorb the short-duration voltage pulses during the ESD strike, wherein the PFOD is directly connected to the I/O pin 602 without passing through any other circuit element; an anode of the diode D9 is directly connected to the I/O pin 602 without passing through any other circuit element, and a cathode of the diode D9 is coupled to a supply voltage VDD, that is, there may or may not be other circuit element(s) between the cathode of the diode D9 and the supply voltage VDD. In addition, a bulk of the PFOD is connected to a bias voltage provided by the control circuit 620.

In other embodiments, the diode D2 shown in FIG. 2, the diodes D3-D5 shown in FIG. 3, the diodes D6-D8 shown in FIG. 4 can be applied to the chip 600. These alternative designs shall fall within the scope of the present invention.

Figure 7:
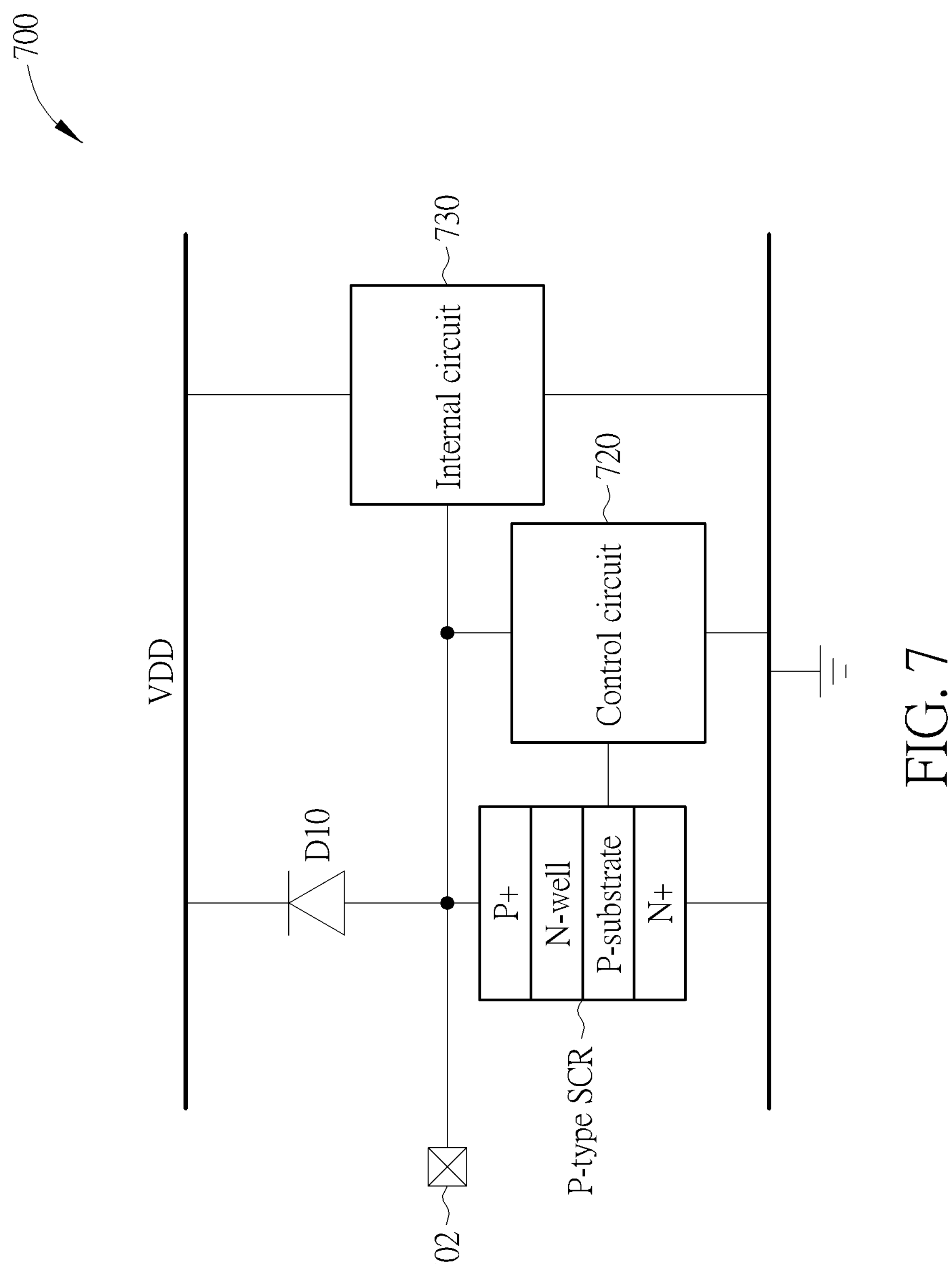
FIG. 7 is a diagram illustrating a chip according to a sixth embodiment of the present invention.

FIG. 7 is a diagram illustrating a chip 700 according to one embodiment of the present invention. As shown in FIG. 7, the chip 700 comprises an I/O pin 702, a control circuit 720, an internal circuit 730, and an ESD protection circuit comprising a P-type silicon controlled rectifier (SCR) and at least one diode D10, wherein the I/O pin 702 is used to receive a negative voltage from a device external to the chip 700, and the negative voltage is lower than a ground voltage.

In the embodiment shown in FIG. 7, the P-type SCR and the diode D10 serves as the ESD protection circuit to absorb the short-duration voltage pulses during the ESD strike. The P-type SCR comprises P+ diffusion, N-well, P-type substrate and N+ diffusion, wherein the P+ diffusion is directly connected to the I/O pin 702 without passing through any other circuit element, and the N+ diffusion is coupled to the ground voltage. An anode of the diode D10 is directly connected to the I/O pin 702 without passing through any other circuit element, and a cathode of the diode D10 is coupled to a supply voltage VDD, that is, there may or may not be other circuit element(s) between the cathode of the diode D10 and the supply voltage VDD. In addition, the P-type substrate is connected to a bias voltage provided by the control circuit 720.

In other embodiments, the diode D2 shown in FIG. 2, the diodes D3-D5 shown in FIG. 3, the diodes D6-D8 shown in FIG. 4 can be applied to the chip 700. These alternative designs shall fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip, comprising:

an input/output (I/O) pin;

an electrostatic discharge (ESD) protection circuit comprising a P-type device and a first diode, wherein the P-type device is coupled between the I/O pin and a ground voltage, and an anode of the first diode is directly connected to the I/O pin;

wherein the ESD protection circuit does not comprise any device whose N-type doping/diffusion is directly connected to the I/O pin;

wherein the I/O pin is used to receive a negative voltage from a device external to the chip during a normal operating state, and the negative voltage is lower than the ground voltage; and the P-type device is disabled when the I/O pin has the negative voltage.

2. The chip of claim 1, wherein the P-type device is a P-type transistor, a P-type field-oxide device (PFOD) or a P-type silicon controlled rectifier (SCR).

3. The chip of claim 1, wherein the P-type device is a P-type transistor, a drain electrode of the P-type transistor is directly connected to the I/O pin, a source electrode of the P-type transistor is coupled to the ground voltage; and the chip further comprises:

an ESD detection circuit, configured to detect a voltage level of the I/O pin to determine if generating a control signal to enable the P-type transistor.

4. The chip of claim 3, wherein the ESD detection circuit does not comprise any device whose N-type doping/diffusion is directly connected to the I/O pin.

5. The chip of claim 1, further comprising:

an internal circuit directly connected to the I/O pin, wherein the internal circuit does not comprise any device whose N-type doping/diffusion is directly connected to the I/O pin.

6. The chip of claim 1, wherein a cathode of the first diode is coupled to a supply voltage or the ground voltage.

7. The chip of claim 1, wherein a cathode of the first diode is coupled to a supply voltage; and the ESD protection circuit further comprises:

a second diode, wherein an anode of the second diode is coupled to the ground voltage, and a cathode of the second diode is coupled to the P-type device.

8. The chip of claim 1, wherein a cathode of the first diode is coupled to the ground voltage; and the ESD protection circuit further comprises:

a second diode, wherein an anode of the second diode is coupled to the ground voltage, and a cathode of the second diode is coupled to the P-type device.

* * * * *